(12) United States Patent
Reykowski (10) Patent No.: US 6,806,711 B2
(45) Date of Patent: Oct. 19, 2004

(54) HIGH-FREQUENCY VOLUME COIL/SURFACE COIL ARRANGEMENT FOR A MAGNETIC RESONANCE TOMOGRAPHY APPARATUS

(75) Inventor: Arne Reykowski, Erlangen (DE)

(73) Assignee: Siemens Aktiengesellschaft, Münich (DE)

( * ) Notice: Subject to any disclaimer, the term of this patent is extended or adjusted under 35 U.S.C. 154(b) by 19 days.

(21) Appl. No.: 10/152,895

(22) Filed: May 21, 2002

(65) Prior Publication Data

US 2002/0198450 A1 Dec. 26, 2002

(30) Foreign Application Priority Data

May 30, 2001 (DE) .......................................... 101 26 338

(51) Int. Cl.[7] .............................................. G01V 3/00
(52) U.S. Cl. ..................................................... 324/318
(58) Field of Search ................................ 324/300–309, 324/311, 314, 318–322; 600/410, 422; 333/219, 230

(56) References Cited

U.S. PATENT DOCUMENTS

| | | | | |
|---|---|---|---|---|
| 4,623,844 A | * | 11/1986 | Macovski | 324/320 |
| 4,680,549 A | | 7/1987 | Tanttu | |
| 4,879,516 A | * | 11/1989 | Mehdizadeh et al. | 324/318 |
| 4,918,388 A | * | 4/1990 | Mehdizadeh et al. | 324/322 |
| 5,059,906 A | * | 10/1991 | Yamanaka | 324/318 |
| 5,198,768 A | * | 3/1993 | Keren | 324/318 |
| 5,394,087 A | * | 2/1995 | Molyneaux | 324/318 |
| 5,473,251 A | * | 12/1995 | Mori | 324/318 |
| 5,500,596 A | * | 3/1996 | Grist et al. | 324/318 |
| 5,617,027 A | | 4/1997 | Decke | |
| 5,666,055 A | * | 9/1997 | Jones et al. | 324/318 |
| 5,682,098 A | * | 10/1997 | Vij | 324/318 |
| 5,699,802 A | | 12/1997 | Duerr | |
| 5,757,189 A | * | 5/1998 | Molyneaux et al. | 324/318 |
| 5,951,474 A | * | 9/1999 | Matsunaga et al. | 600/422 |
| 6,060,882 A | * | 5/2000 | Doty | 324/318 |
| 6,169,401 B1 | * | 1/2001 | Fujita et al. | 324/318 |
| 6,300,761 B1 | * | 10/2001 | Hagen et al. | 324/318 |
| 6,317,091 B1 | * | 11/2001 | Oppelt | 343/742 |
| 6,377,044 B1 | * | 4/2002 | Burl et al. | 324/307 |
| 6,504,369 B1 | * | 1/2003 | Varjo et al. | 324/318 |
| 6,624,633 B1 | * | 9/2003 | Zou et al. | 324/318 |
| 2002/0196021 A1 | * | 12/2002 | Wang | 324/318 |
| 2003/0060699 A1 | * | 3/2003 | Creemers | 600/410 |

* cited by examiner

Primary Examiner—Christopher W. Fulton
Assistant Examiner—Dixomara Vargas
(74) Attorney, Agent, or Firm—Schiff Hardin LLP (57) ABSTRACT

High-frequency coil arrangement for a magnetic resonance tomography apparatus and magnetic resonance tomography apparatus employing such an arrangement have a surface coil and a loop coil for enclosing the examination subject. Both coils are fashioned for receiving the same first polarization component. A switching device is present for alternately deactivating and/or activating the surface coil and the loop coil. The two coils are preferably arranged on a common carrier structure that is bendable.

24 Claims, 6 Drawing Sheets

HIGH-FREQUENCY VOLUME COIL/SURFACE COIL ARRANGEMENT FOR A MAGNETIC RESONANCE TOMOGRAPHY APPARATUS

BACKGROUND OF THE INVENTION

1. Field of the Invention

The present invention is directed to the field of magnetic resonance techniques, particularly to the field of imaging magnetic resonance tomography systems.

The invention relates to a high-frequency coil arrangement for examining a subject, particularly a patient, in a magnetic resonance tomography apparatus, particularly in an imaging magnetic resonance tomography apparatus, of the type having a loop coil for receiving an electromagnetic high-frequency signal from the examination subject, the loop coil having at least one conductor loop that is suitable for enclosing the examination subject.

The invention also is directed to a magnetic resonance tomography apparatus for examining a patient, with means for generating a static magnetic field that is vertically oriented with respect to the patient axis.

2. Description of the Prior Art

In a magnetic resonance tomography apparatus for medical applications, particularly for medical diagnosis, the patient to be examined normally is introduced into the examination area with the patient lying flat. The intense static magnetic field, which is required in the examination area, is generated either by a permanent magnet or by an electrical coil that is preferably superconductive. In a magnetic resonance tomography apparatus having a permanent magnet that is used for generating low or medium field intensities, the magnetic field is vertically oriented as a result of the medically required horizontal support of the patient and the installation of the magnet resulting therefrom. This is referred to as a vertical field device. By contrast, the static magnetic field is oriented parallel to the patient axis, (horizontally) when an electrical magnet coil is used for obtaining particularly high field intensities.

A transmission coil or reception coil is used for transmitting high-frequency pulses into the examination subject and for receiving electromagnetic high-frequency signals proceeding from the examination subject. Most of the coils used for these purposes can be divided into two categories regarding their field distribution: These are volume coils, which generate a homogenous magnetic field in an area within the coil, and surface coils, which generate a more or less non-homogeneous magnetic field outside of the coil. With a volume coil, the examination subject, therefore, is normally arranged in the inside of the coil, whereas a surface coil is usually attached to the surface of the examination subject or is placed on the surface of the examination subject. For example, a solenoid is a typical volume coil having a predominantly homogenous field distribution in its interior, namely a wound coil with windings wound on a surface of a cylinder and that is coaxial relative to the patient axis. The solenoid could also be referred to as a loop coil having a number of conductor loops. A loop coil having only one conductor loop or only a few conductor loops could be used as a surface coil, but could also be referred to as a volume coil having a reduced field homogeneity, particularly when the conductor loops enclose the examination subject.

In order to obtain an optimally homogeneous field distribution in the measuring volume, a volume coil or some other antenna having a homogeneous field distribution is normally used for transmitting the high-frequency pulses.

Volume coils have the disadvantage, particularly when only a specific partial area of the examination subject, particularly of the human body, is to be imaged, that the signal-to-noise ratio of the magnetic resonance examination is negatively influenced due to the low filling factor. Therefore, surface coils are used as reception coils, particularly when the partial area to be examined cannot be enclosed by a coil, i.e., the homogeneity of the high-frequency reception characteristic is partially sacrificed for the benefit of a larger filling factor for locally obtaining an optimally efficient signal-to-noise ratio.

In a vertical field device, the imaging electromagnetic high-frequency signal originating from the examination subject is essentially horizontally oriented with respect to its circular polarization (magnetic field component). One method for receiving the circularly polarized high-frequency signal is to separately receive two orthogonal components, e.g. a first polarization component parallel to the patient axis and a second polarization component perpendicular to the patient axis.

A loop coil enclosing the entire patient body or an extremity to be examined can be used for receiving the first polarization component that is oriented parallel to the patient axis. The diameter of the subject to be examined is limited from above due to the interior area that is enclosed by the loop coil. Therefore, loop coils with different diameters have been used, with a suitable coil being selected for the respective patient. This work is laborious for the medical staff since electrical contact connections must be repeatedly made. Moreover, with an extremely adipose patient, it may occur that none of the present coils has a sufficient diameter. This problem particularly occurs when the spine is to be imaged since the loop coil must enclose the entire patient body rather than only an extremity (arm or leg).

SUMMARY OF THE INVENTION

An object of the invention is to provide a high-frequency coil arrangement wherein the number of necessary reception coil changes is reduced, and which is particularly suitable for examining extremely adipose patients. A further object is to provide a magnetic resonance tomography apparatus employing such a high-frequency coil management.

The initial object, with respect to the aforementioned high-frequency coil arrangement, is inventively achieved by providing a surface coil in addition to the loop coil, with the surface coil and the loop coil being fashioned for receiving the same first polarization component of the high-frequency signal.

These terms are used herein consistent with the earlier explanations made in the beginning regarding the terms "surface coil" and "loop coil". The surface coil of the invention is fashioned in a particularly flat manner and is suitable for placing the examination subject or the patient thereon and is suitable for laterally being placed against the examination subject or patient. The loop coil is particularly suitable for enclosing the examination subject. In this sense, the loop coil also can be referred to as a volume coil. The loop number or number of turns, and therefore the expanse of the loop coil along its central coil axis, is preferably significantly less than the width extent. In other words, the loop coil also is fashioned in a flat manner. For example, it can have a single conductor loop or—particularly with respect to a small coil—2, 3, 4 or up to 10 conductor loops.

Preferably, both coils are simultaneously electrically and/or mechanically connected to the magnetic resonance tomography apparatus. Since a surface coil and a loop coil—optionally or simultaneously—are inventively present in the high-frequency coil arrangement for receiving the same polarization component. The advantage results that at least one usable reception coil is always present even for large-volume examination subjects. This is the surface coil.

The surface coil, however, has the disadvantage that it exhibits a low signal-to-noise ratio compared to the loop coil, particularly with respect to a slim patient. This disadvantage, however, is offset by the particular advantage that the inventive high-frequency coil arrangement, as a result of the presence of the surface coil, provides a high-frequency signal for magnetic resonance tomography examinations even if the loop coil can no longer be used. This is not possible for an especially adipose patient or for a patient with injuries or applied bandage material, for example. Therefore, the inventive high-frequency coil arrangement is not limited, in application by the size or the nature of the patient's dimensions. Moreover, the loop coil can be used for a slim patient with (unmodified) high image quality.

Therefore, the first polarization component can be optionally measured with the surface coil or with the loop coil. However, it also can be measured simultaneously by both coils at the same time, particularly for an examination subject having a small volume.

The surface coil is preferably fashioned as a butterfly coil or a saddle coil. The text by Marinus Ir. Vlaardingerbroek and Jacques A. den Boer, "Magnetic Resonance Imaging", Springer Berlin, 1996, page 32 to 38 describes the details of these coil variants.

In a preferred embodiment of the high-frequency coil arrangement, the high-frequency arrangement has a further surface coil which is fashioned for receiving a second polarization component of the high-frequency signal, the second polarization component being perpendicularly oriented relative to the first polarization component, and the further surface coil preferably is fashioned as a butterfly coil or saddle coil. The presence of the further surface coil provides the advantage that both field components of the circularly polarized magnetic field portion of the electromagnetic high-frequency signal can be detected.

In a preferred embodiment, the received signal of the surface coil and the received signal of the loop coil are tapped via a common electrical line. The two coils, therefore, have common contact locations. As a result, a simple, high-frequency-compatible circuit structure can be achieved.

The received signal of the surface coil and the received signal of the loop coil are supplied to a common amplifier, particularly to a common preamplifier which is connected to the common electrical line, for example. As a result, duplicative electrical components can be possibly foregone.

In a preferred embodiment, the surface coil and the loop coil and optionally the further surface coil are arranged on a common, preferably flexible carrier structure. As a result, the high-frequency coil arrangement, when used as a local coil, is easy to handle and can be adapted to different patient surfaces.

A further advantage is achieved when the loop coil is arranged on the carrier structure such that enclosure of the examination subject by the loop coil can be obtained by bending the carrier structure. Then, the high-frequency coil arrangement, in an unbent or planar state of the carrier structure, is suitable, for example, for placement on the patient, or for pushing beneath the patient. The loop coil is formed in the bent state. This has the advantage that not only a surface coil but also a coil enclosing the volume of the patient is realized by the same carrier structure handled by the operating staff.

In another preferred embodiment, a detachable connector, particularly a plug, is integrated into the conductor loop(s) for electrically closing and/or interrupting the loop coil. It is thus possible, for example, to close the conductor loop(s) and therefore allow use of the loop coil for imaging, with bending of the carrier structure, by plugging the plug in a corresponding socket on the opposite side. By such plugging of the conductor loop(s), it is possible to enclose the patient without having to extend the patient through an opening defined by the coil.

In a preferred embodiment, the high-frequency coil arrangement has a switching device for alternately deactivating and/or activating the surface coil and the loop coil. Therefore, either the loop coil or the surface coil is active. Disturbing mutual reactions of the two resonant coils thus are prevented.

The switching device preferably has a blocking arrangement for interrupting and/or reducing the current flow in the surface coil. The blocking arrangement can be fashioned as a blocking oscillating circuit. The oscillating circuit is closed, for example, for deactivating the surface coil.

The switching device can have switches which, for example, are operated by a control unit in an automated fashion.

Furthermore, it is particularly expedient to integrate the aforementioned detachable connector, for electrically closing and/or interrupting the loop coil into the switching device. The switching preferably occurs by creating a plug connection which can be manually effected.

The switching device is preferably fashioned such that the blocking arrangement is made effective when the loop coil is closed by the connecting means. It is thus guaranteed that only one of the two coils is activated.

In a particularly practical embodiment, the switching device has a plug with a number of contacts and a corresponding socket, with at least some of the contacts being a part of the connector of the loop coil and at least some of the contacts being allocated to the blocking arrangement of the surface coil. For example, the following actions are carried out by plugging the plug into the socket:

a) Closing (activating) the loop coil b) Deactivating the surface coil, particularly by closing of one of the oscillator circuits.

Since these actions are executed only by a closing procedure that can be manually carried out, control (for this purpose) of the magnetic resonance tomography apparatus by, for example, an electronic is not necessary.

Alternatively or in addition to the switching device, the high-frequency coil arrangement can have an arrangement for electrically decoupling the surface coil from the loop coil. This is particularly advantageous when the surface coil and the loop coil are simultaneously operated.

The arrangement for electrically decoupling the two coils has an overall capacitance which is selected such that the overall inductance is exactly compensated.

For simultaneously processing the received signals originating from the surface coil and the loop coil, a summing device is provided with which these signals—preferably weighted—are added.

The second object is achieved in a magnetic resonance tomography apparatus in accordance with the invention having a high-frequency coil arrangement as described above.

Preferably, the magnetic resonance tomography apparatus is a vertical field apparatus.

The surface coil and the loop coil, then, preferably are fashioned for receiving a first polarization component that is oriented parallel to the patient axis.

In particular, the inventive magnetic resonance tomography apparatus also has the aforementioned further surface coil which is preferably fashioned for receiving a second polarization component that is perpendicularly oriented relative to the direction of the static magnetic field and the patient axis.

In an inventive magnetic resonance tomography apparatus having the aforementioned carrier structure, the carrier structure preferably can be carried, and in particular can be gripped, by the operating staff and is fashioned for the local examination of the patient.

DESCRIPTION OF THE PREFERRED EMBODIMENTS

Figure 1:
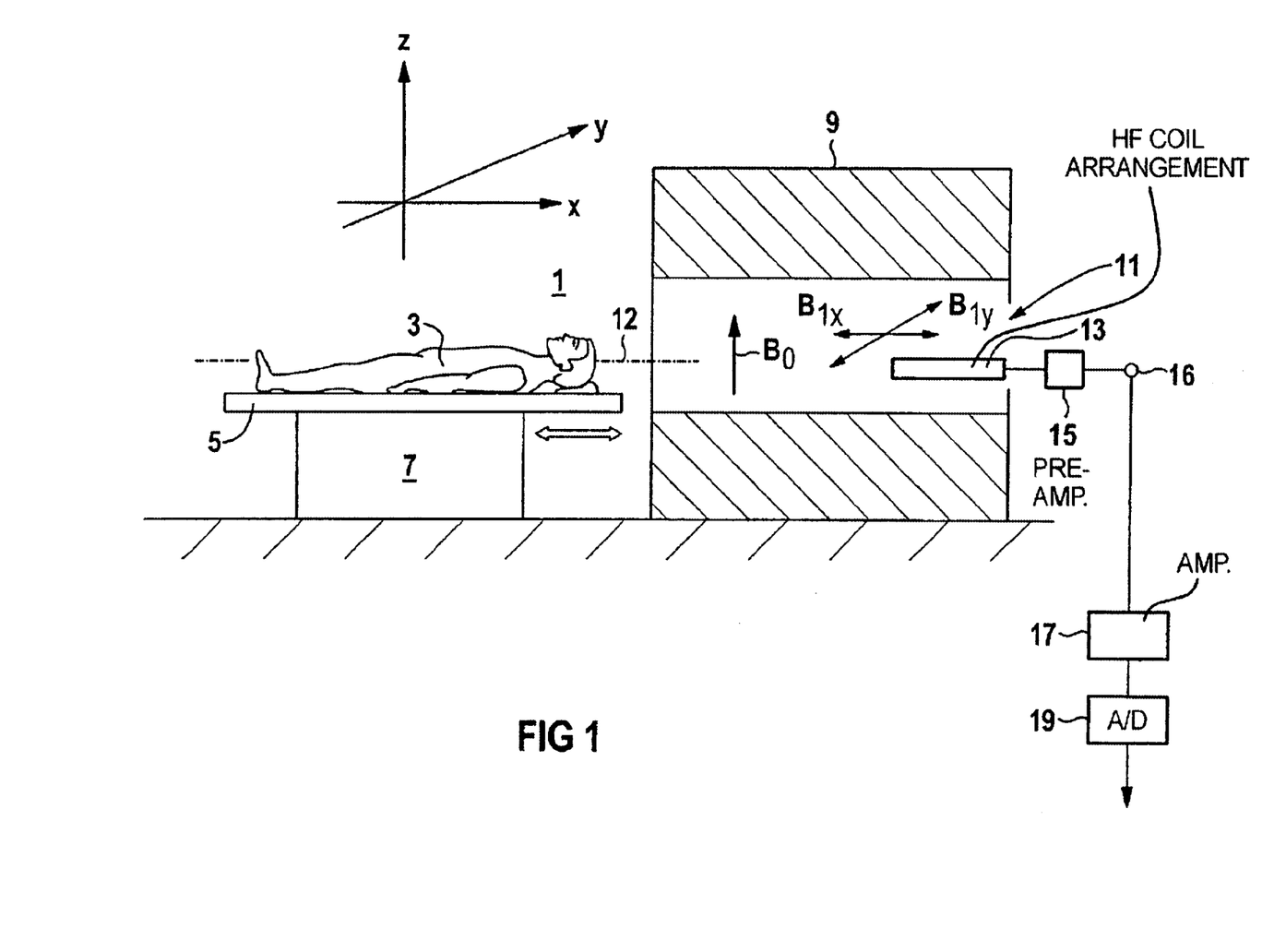
FIG. 1 illustrates an inventive magnetic resonance tomography apparatus in a schematic general view.

FIG. 1 shows a magnetic resonance tomography apparatus 1 with which a region of an examination subject or a patient 3 is to be examined by imaging. The patient 3 is shown in a position prior to the examination; the patient 3 is placed on a horizontally displaceable bed 5 carried by a support 7.

In order to generate a static magnetic field B0, the magnetic resonance tomography apparatus has a permanent magnet 9 with an opening 11 in which the actual examination occurs. A transmission coil (not explicitly shown) irradiates high-frequency pulses into the patient 3 who is introduced into the opening 11. Echo signals originating from the patient 3 are received by a high-frequency coil arrangement 13 and are supplied to an A/D converter 19 via a preamplifier 15 and an amplifier 17. FIG. 1 shows a connecting point 16 as a reference point for the following figures.

The magnetic field component of the high-frequency field received by the high-frequency coil arrangement 13 is circularly polarized in the horizontal plane (x-y). The corresponding field components are referred to as a first polarization component $B_{1x}$ and a second polarization component $B_{1y}$.

Figure 2:
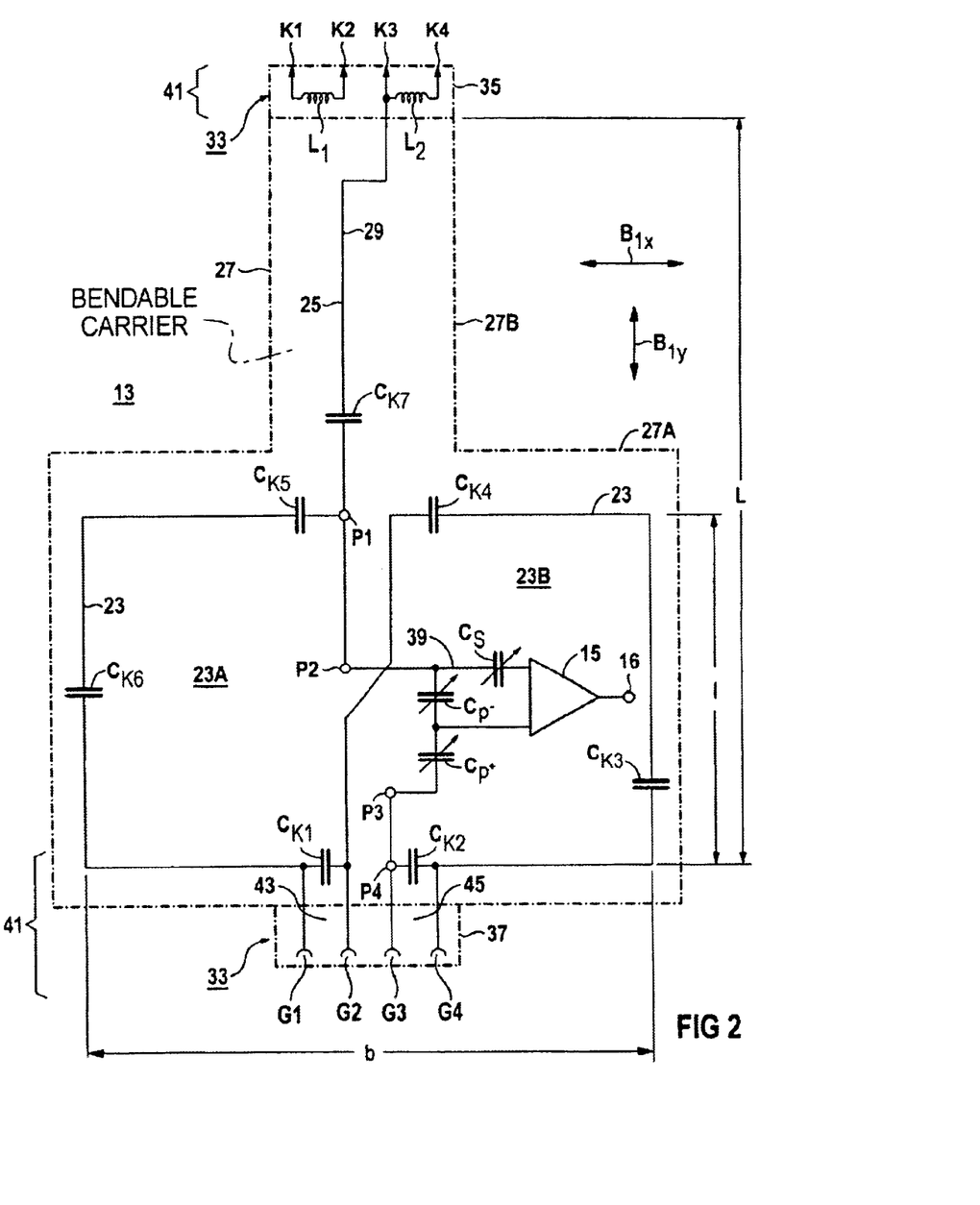
FIG. 2 illustrates a high-frequency coil arrangement for the magnetic resonance tomography apparatus according to a first embodiment.

FIG. 2 shows the high-frequency coil arrangement 13 of FIG. 1 according to a first embodiment. The high-frequency coil arrangement 13 has a surface coil 23 that is fashioned as a butterfly coil and has a loop coil 25 with only a single loop. The two coils 23, 25 are attached to a common carrier structure 27 which is composed of soft, flexible material, preferably plastic.

The carrier structure 27 has a planar base part 27A and a longitudinally extended ring part 27B. The surface coil 23 is fastened in the base part 27A. The loop coil 25 extends through the base part 27A and through the ring part 27B, so that a closed conductor loop 29 of the loop coil 25 can be realized by bending the ring part 27B, which is represented in a planar fashion in FIG. 2 (from the plane of projection), so as to form a ring.

A connector 33 is present for this purpose which includes a plug 35, which is attached to the end of the ring part 27B and which has electrical contacts K1, K2, K3, K4, and a corresponding socket which is attached to the base part 27A and which has correspondingly suitable counter contacts G1, G2, G3, G4. Given a plugged or connected loop coil 25, the contact K3 is connected to the corresponding counter contact G3, so that a more or less ring-shaped conductor loop 29 is formed which has the points P1, P2, P3, P4.

The surface coil 23 has a left-side coil part 23A and a right-side coil part 23B which, somewhat in the form of an "eight", are connected to one another by crossing lines (butterfly coil).

Shortening capacitors $C_{K1}$, $C_{K2}$, $C_{K3}$, $C_{K4}$, $C_{K5}$, $C_{K6}$ and $C_{K7}$, which have a capacitance of 200 pF for example, are integrated into the surface coil 23 and into the loop coil 25.

The line section P1-P2-P3-P4 is a part of the surface coil 23 and a part of the loop coil 25. At the points P2, P3, the received signals from both coils 23, 25 can be tapped via a common line 39. A common matching capacitor CS is present in order to match the impedance of the line 39 to the coils 23, 25. Tuning capacitors Cp-, Cp+ make it possible to adapt the coil resonance frequency to the Larmor frequency of the high-frequency field.

The received signals can be supplied to the preamplifier 15 via the line 39. In FIG. 2, the line 39 ends at the point 16, which is also shown in FIG. 1.

The previously mentioned connector 33, which includes the plug 35 and the socket 37, is a part of a switching device 41 for alternately deactivating and/or activating the surface coil 23 and the loop coil 25. The function of this switching device 41 is subsequently explained for the example of activating the loop coil 25 and simultaneously deactivating the surface coil 23. As already explained, the conductor loop 29 of the loop coil 25, via the contact K3 and the counter contact G3, is closed by plugging the plug 35 into the socket 37 and the loop coil 25, therefore, is activated for imaging. The contacts K1 to K4 and the counter contacts G1 to G4 are used for deactivating the surface coil 23. For this purpose, the switching device 41 has a first blocking coil L1 (L1≈0.08 μF) and a second blocking coil L2 (e.g. L2≈0.08 μF) which are connected in the plug 35 between contact pair K1, K2 and contact pair K3, K4, respectively. Oscillating circuits 43, 45, which are formed by the shortening capacitor $C_{K1}$ and the first blocking coil $L_1$, and by the shortening capacitor $C_{K2}$ and the second blocking coil $L_2$, are closed by plugging the plug 35 into the socket 37. The oscillating circuits 43, 45 $((L_1 \cdot C_{K1})^{-\frac{1}{2}} = (L_2 \cdot C_{K2})^{-\frac{1}{2}} = W_{Larmor} = 2\pi f_{Larmor})$ tuned to the resonance frequency of the magnetic resonance tomography apparatus 1 act as a blocking circuit and therefore mostly prevent the current flow in the surface coil 23. The left-sided coil part 23A is switched off by the left-side oscillating circuit 43 and the right-side coil part 23B is separately switched off by the right-sided oscillating circuit 45. Then, the surface coil 23 is non-resonating and is no longer active in an imaging fashion.

Instead of the oscillating circuits 43, 45, mechanical interrupters such as switches or push keys that are operated, for example, when the plug 35 is inserted into the socket 37 can be present in order to obtain a blocking effect in the surface coil 23.

The width b of the surface coil 23 is approximately 250 mm and its length 1 is also approximately 250 mm. The length L of the conductor loop 29, which determines the maximum circumference of the loop coil 25, is approximately 560 mm.

Figure 3:
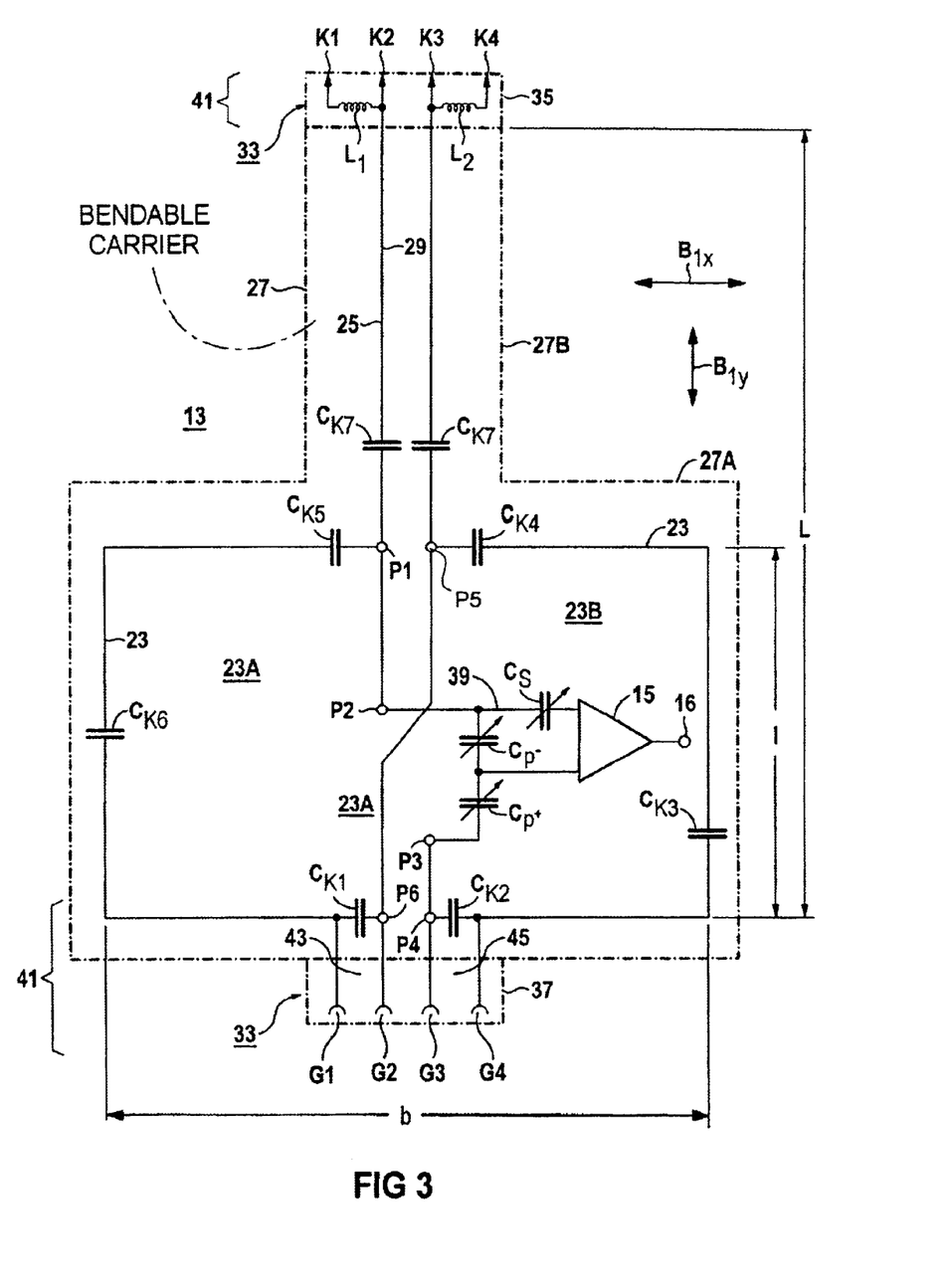
FIG. 3 illustrates a high-frequency coil arrangement for the magnetic resonance tomography apparatus according to a second embodiment.

The second exemplary embodiment of the high-frequency coil arrangement 13 shown in FIG. 3 is generally identical to the one of FIG. 2. In this example, however, the loop coil 25 has two conductor loops 51, 53 that are connected in series to one another and that can be separately plugged by the contact K2 and the counter contact G2, and by the contact K3 and the counter contact G3, respectively.

In the embodiment of FIG. 3, the conductor sections P1-P2-P3-P4 and P5-P6 belong not only to the surface coil 23 but also to the loop coil 25.

Figure 4:
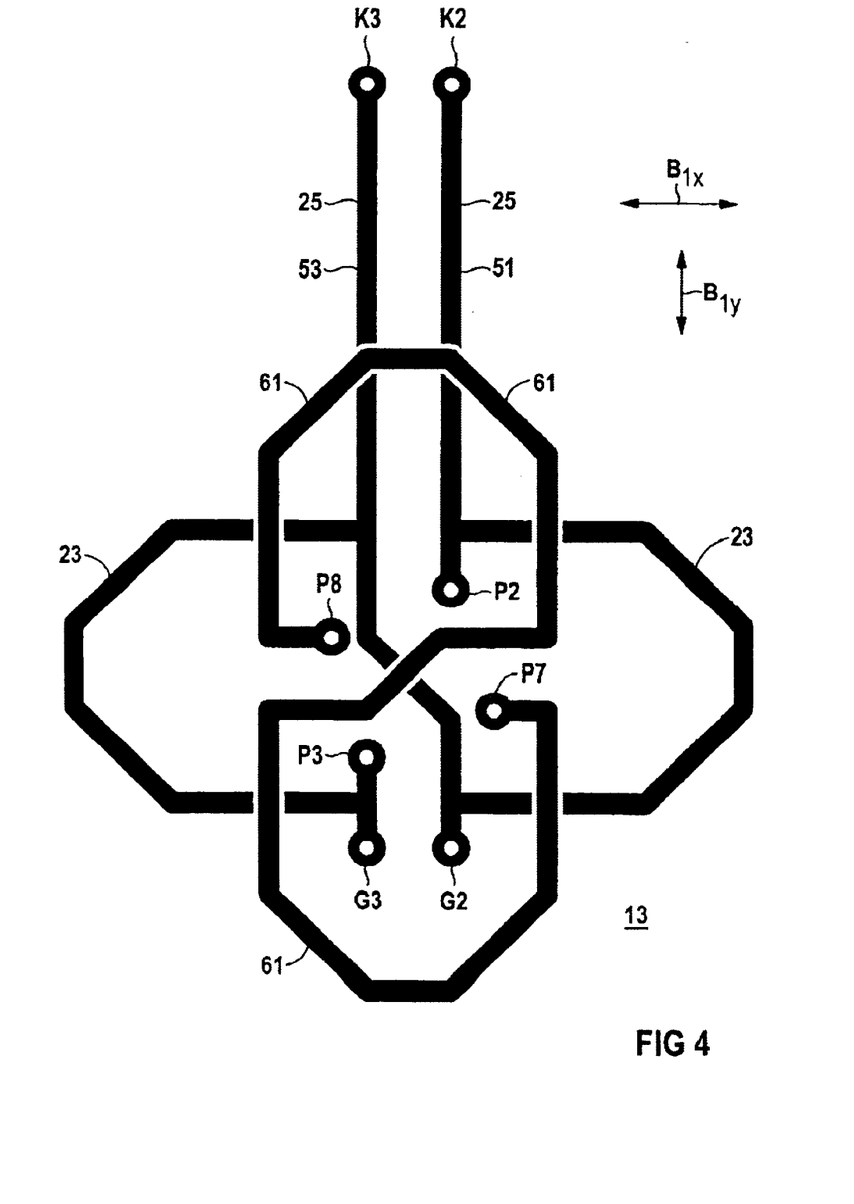
FIG. 4 illustrates a high-frequency coil arrangement for the inventive magnetic resonance tomography apparatus according to a third embodiment.

In the third embodiment of the inventive high-frequency coil arrangement 13 of FIG. 4, a further surface coil 61, which is also fashioned as a butterfly coil, is present in addition to the surface coil 23 and the loop coil 25 which are used for detecting the first polarization component B1x (parallel to the patient axis). The two surface coils 23, 61 are crossed and are arranged such that they are rotated relative one another by 90°, so that the further surface coil 61 can detect the aforementioned second polarization component $B_{1y}$.

FIG. 4 schematically shows the high-frequency coil arrangement 13 realized on a plate by chemical etching. At the points P2, P3, the received signals of the coils 23, 25, which detect the first polarization component B1x, are tapped and the signals generated by the coil 61, which detects for the second polarization component $B_{1y}$, are tapped at separate points P7, P8. In the schematic representation of FIG. 4, switching details, such as capacitors, and the switching device 41 are not shown for clarity. Furthermore, the length L of the conductor loop 29 is not drawn to scale.

Figure 5:
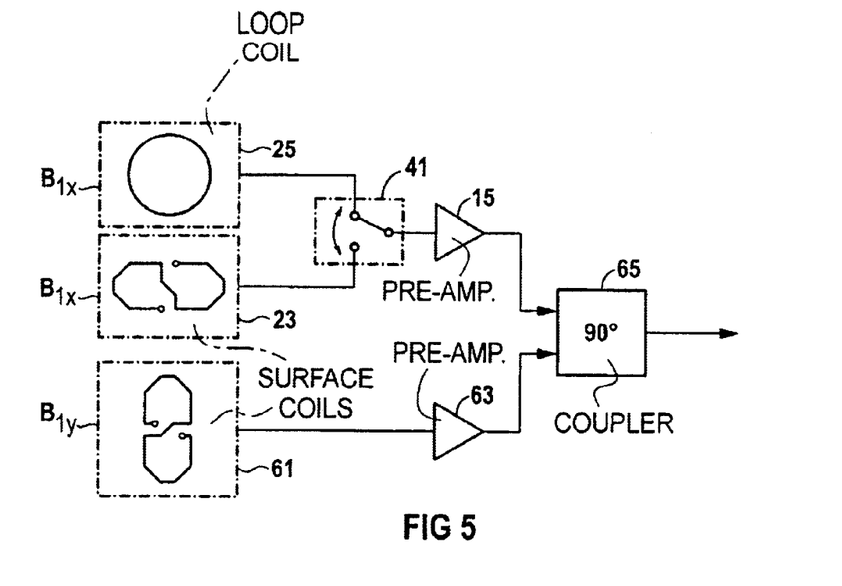
FIG. 5 shows a first exemplary embodiment for the electrical wiring of the reception channels of the inventive high-frequency coil arrangement.
Figure 6:
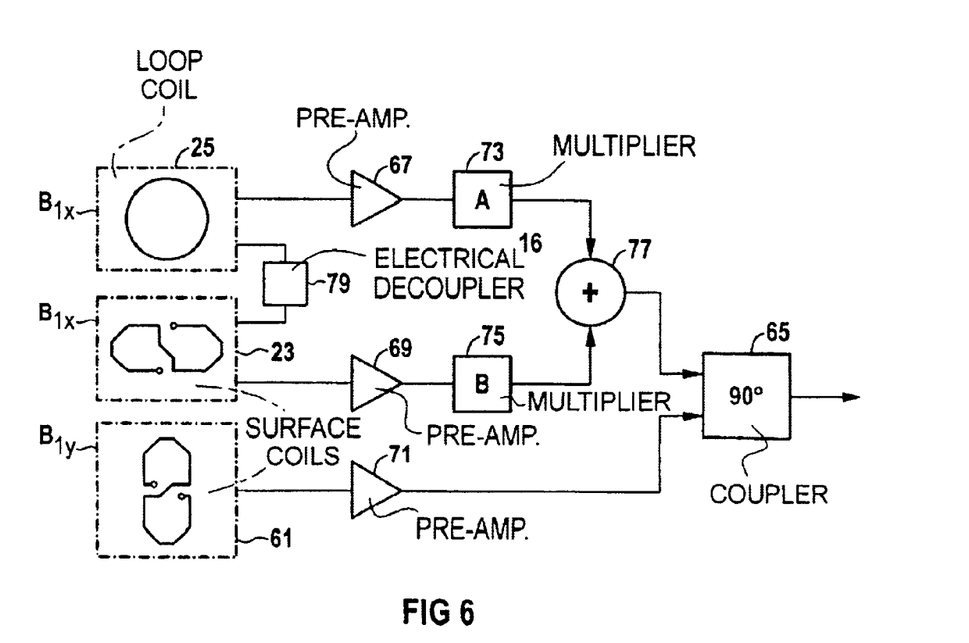
FIG. 6 shows a second exemplary embodiment for the electrical wiring of the reception channels of the inventive high-frequency coil arrangement.

FIG. 5 and FIG. 6 are examples of how the receive signals are further processed in the high-frequency coil arrangement of FIG. 4, wherein the high-frequency coil arrangement has three coils 23, 25, 61. FIGS. 6 and 6 only show the wiring of the coils 23, 25, 61 in a functional way without providing electronic details.

As shown in FIG. 5, the output signals of the surface coil 23 and of the loop coil 25 are alternately supplied to the preamplifier 15 by using the switching device 41. The received signal of the further surface coil 61, via a separate preamplifier 63 that is allocated to it, arrives at a 90°-coupler (90°-combiner) 65 which takes the 90° phase quadrature between the two polarization components $B_{1x}$, $B_{1y}$ into consideration.

FIG. 6 shows an exemplary embodiment wherein the coils 23, 25 are simultaneously operated for measuring the first polarization component $B_{1x}$. Their output signals are amplified via respective preamplifiers 67 and 69. The wiring is different here from that of FIGS. 2 and 3. The amplified signals, in respective multipliers 73 and 75, are multiplied by weighting factors A, B and are supplied to a summing device 77. The output signal of the summing device 77 arrives at the 90° coupler 65 together with the output signal of the separate preamplifier 71 allocated to a further surface coil 61.

An arrangement 79 for electrically decoupling the two coils 23, 25 is present, so that the simultaneously resonant coils 23, 25 do not negatively influence each other with respect to the measuring of the first polarization component B1x. The arrangement 79 for the electrical decoupling has an overall capacitance, for example, such that the overall inductance is compensated.

Figure 7:
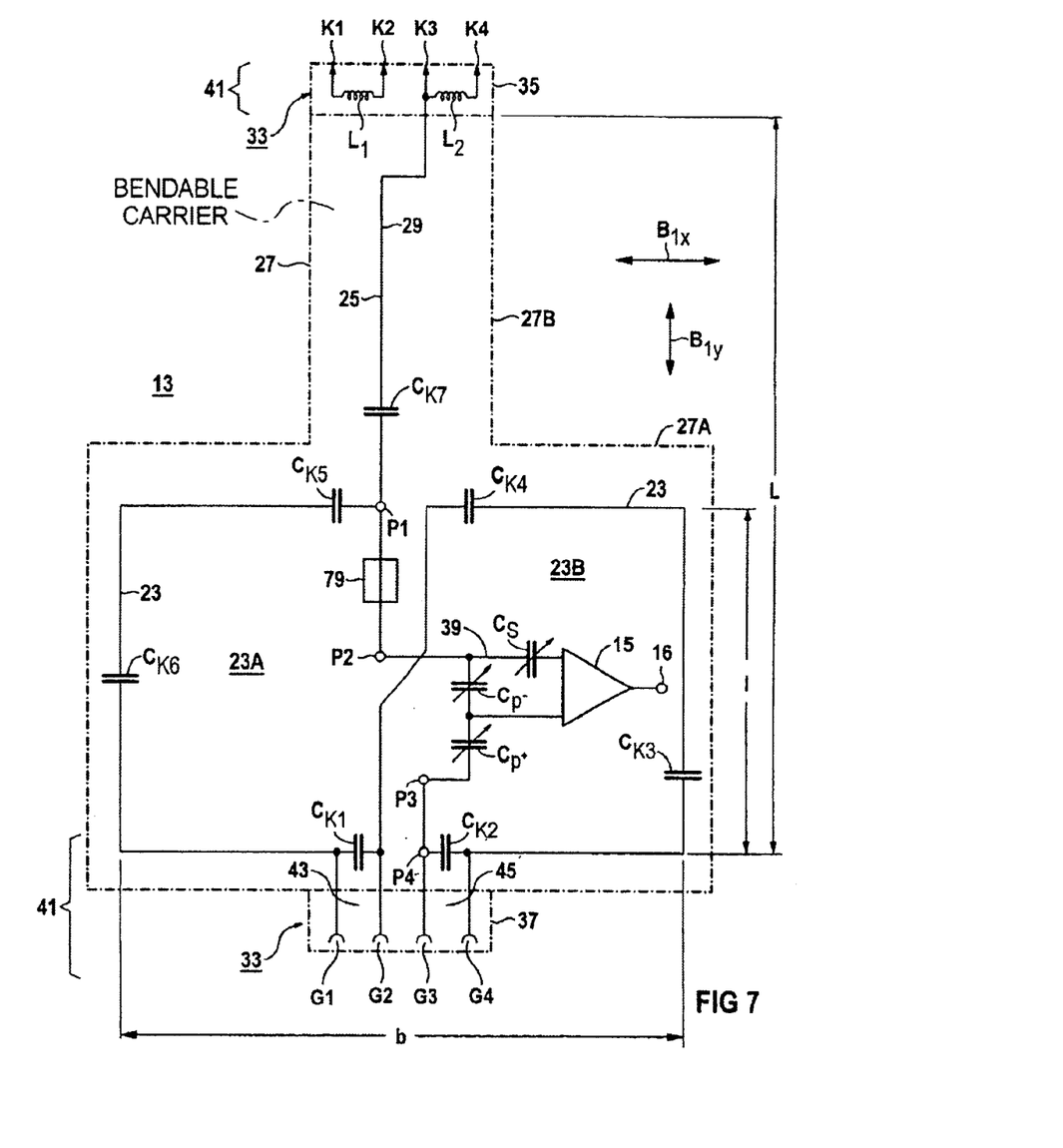
FIG. 7 illustrates a high-frequency coil arrangement for the inventive magnetic resonance tomography apparatus according to a fourth embodiment.

The arrangement 79 for the electrical decoupling also can be present when the coils 23, 25 (as shown in FIG. 5) are alternately activated for imaging by the switching device 41. This is shown in FIG. 7 which represents a corresponding modification of the exemplary embodiment of FIG. 2.

Although modifications and changes may be suggested by those skilled in the art, it is the intention of the inventor to embody within the patent warranted hereon all changes and modifications as reasonably and properly come within the scope of his contribution to the art.

I claim as my invention:

1. A high-frequency coil arrangement for detecting electromagnetic signals from a subject having a body circumference, said electromagnetic signals representing nuclear magnetic resonance signals arising due to excitation of nuclear spins in said subject, said high-frequency coil arrangement comprising:

a loop coil for receiving an electromagnetic high-frequency signal from a subject in which nuclear spins have been excited, said high-frequency signal having a first polarization component and a second polarization component oriented perpendicularly relative to said first polarization component, said loop coil comprising at least one conductor loop adapted for surrounding said body circumference of said subject; and a surface coil, said surface coil and said loop coil both receiving said first polarization component of said high-frequency signal.

2. A high-frequency coil arrangement as claimed in claim 1 wherein said surface coil is a coil selected from the group consisting of butterfly coils and saddle coils.

3. A high-frequency coil arrangement as claimed in claim 1 comprising:

a further surface coil for receiving said second polarization component of said high-frequency signal, said further surface coil being a coil selected from the group consisting of butterfly coils and saddle coils.

4. A high-frequency coil arrangement as claimed in claim 1 wherein said loop coil generates a loop coil received signal dependent on said first polarization component and wherein said surface coil generates a surface coil received signal dependent on said first polarization component, and wherein said high-frequency coil arrangement further comprises a common electrical line connected to said surface coil and to said loop coil for tapping said surface coil received signal and said loop coil received signal.

5. A high-frequency coil arrangement as claimed in claim 4 further comprising a preamplifier connected to said electrical line.

6. A high-frequency coil arrangement as claimed in claim 1 comprising a bendable carrier structure on which said surface coil and said loop coil are disposed.

7. A high-frequency coil arrangement as claimed in claim 6 comprising a further surface coil for receiving said second polarization component of said high-frequency signal, said further surface coil also disposed on said carrier.

8. A high frequency coil arrangement as claimed in claim 6 wherein said carrier is bendable to enclose said subject by said loop coil disposed on said carrier.

9. A high-frequency coil arrangement as claimed in claim 1 further comprising a detachable connector integrated into said conductor loop for selectively electrically closing and interrupting said loop coil.

10. A high-frequency coil arrangement as claimed in claim 9 wherein said detachable connector is a plug.

11. A high-frequency coil arrangement as claimed in claim 1 comprising a switching device connected to said loop coil and to said surface coil for activating and deactivating said surface coil and said loop coil in alternation.

12. A high-frequency coil arrangement as claimed in claim 11 wherein said switching device comprises a blocking circuit for at least reducing current flow in said surface coil.

13. A high-frequency coil arrangement as claimed in claim 12 wherein said blocking circuit comprises a blocking oscillator circuit.

14. A high-frequency coil arrangement as claimed in claim 11 wherein said switching device comprises a detachable connector for selectively electrically closing and interrupting said loop coil.

15. A high-frequency coil arrangement as claimed in claim 14 wherein said detachable connector is a plug.

16. A high-frequency coil arrangement as claimed in claim 14 wherein said switching device comprises a blocking circuit for at least reducing current flow in said surface coil, and wherein said switching device activates said blocking circuit when said loop coil is closed by said connector.

17. A high-frequency coil arrangement as claimed in claim 16 wherein said switching circuit comprises a plug having a plurality of contacts, and a complementary socket for receiving said plug, at least a first portion of said contacts forming a connector for said loop coil, and at least a second portion of said contacts being connected to said blocking circuit.

18. A high-frequency coil arrangement as claimed in claim 1 further comprising a decoupling arrangement for electrically decoupling said surface coil from said loop coil.

19. A high-frequency coil arrangement as claimed in claim 1 wherein said loop coil generates a loop coil received signal dependent on said first polarization component and wherein said surface coil generates a surface coil received signal dependent on said first polarization component and wherein said high-frequency coil arrangement further comprises:
 a switching device connected to said surface coil and to said loop coil for activating and deactivating said surface coil and said loop coil in alternation;
 said switching device including a detachable connector for electrically closing and interrupting said loop coil, and a blocking circuit which at least reduces current flow in said surface coil when said loop coil is closed by said connector; and
 a summing device connected to said surface coil and to said loop coil for weighted adding of said surface coil received signal and said loop coil received signal.

20. An arrangement for obtaining magnetic resonance data in a magnetic resonance tomography apparatus, comprising:
 a basic field magnet adapted to receive a patient, having body with a body circumference and a patient axis, therein, said basic field magnet generating a static magnetic field which is vertically oriented relative to said patient axis; and
 a high-frequency coil arrangement for receiving an electromagnetic high-frequency signal from said patient, in whom nuclear spins have been excited, said high-frequency signal having a first polarization component and a second polarization component oriented perpendicularly to said first polarization component, said high-frequency coil arrangement comprising a loop coil having at least one conductor loop adapted for surrounding said body circumference of said patient, and a surface coil, said loop coil and said surface coil each receiving said first polarization component of said high-frequency signal.

21. An arrangement as claimed in claim 20 wherein said surface coil and said loop coil receive said first polarization component which is oriented parallel to said patient axis.

22. An arrangement as claimed in claim 20 wherein said high-frequency coil arrangement comprises a further surface coil for receiving said second polarization component, said second polarization component being perpendicularly oriented relative to said patient axis.

23. An arrangement as claimed in claim 22 wherein said high-frequency coil arrangement comprises a carrier on which said loop coil, said surface coil and said further surface coil are disposed, said carrier being adapted for manual carrying for local examination of said patient.

24. An arrangement as claimed in claim 20 wherein said high-frequency coil arrangement comprises a carrier on which said loop coil and said surface coil are disposed, said carrier being adapted for manual carrying for local examination of said patient.

* * * * *